(12) United States Patent
Johnson

(10) Patent No.: US 6,392,187 B1
(45) Date of Patent: May 21, 2002

(54) APPARATUS AND METHOD FOR UTILIZING A PLASMA DENSITY GRADIENT TO PRODUCE A FLOW OF PARTICLES

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/509,556
(22) PCT Filed: Oct. 15, 1998
(86) PCT No.: PCT/US98/21623
  § 371 Date: May 9, 2000
  § 102(e) Date: May 9, 2000
(87) PCT Pub. No.: WO99/19527
  PCT Pub. Date: Apr. 22, 1999

Related U.S. Application Data
(60) Provisional application No. 60/061,857, filed on Oct. 15, 1997.

(51) Int. Cl.$^7$ ............................................... B23K 26/00
(52) U.S. Cl. .......................... 219/121.43; 219/121.59; 219/121.42; 156/345; 216/55; 118/723 I
(58) Field of Search ..................... 219/121.43, 121.41, 219/121.54, 121.42; 156/345; 118/719, 723 R, 723 I; 204/298.37, 298.38; 216/55, 56, 68

(56) References Cited

U.S. PATENT DOCUMENTS

| | | |
|---|---|---|
| 5,061,838 A | 10/1991 | Lane et al. |
| 5,429,070 A | 7/1995 | Campbell et al. |
| 5,567,268 A | 10/1996 | Kadomura |
| 5,762,750 A | 6/1998 | Chen et al. |
| 5,777,289 A * | 7/1998 | Hanawa et al. ......... 219/121.43 |
| 5,811,022 A * | 9/1998 | Savas et al. ................... 216/68 |
| 5,849,136 A | 12/1998 | Mintz et al. |
| 5,888,414 A * | 3/1999 | Collins et al. ................. 216/68 |
| 6,019,848 A * | 2/2000 | Frankel et al. .............. 118/715 |

* cited by examiner

Primary Examiner—Mark Paschall
(74) Attorney, Agent, or Firm—Oblon, Spivak, McClelland, Maier & Neustadt, PC (57) ABSTRACT

An apparatus and method which uses a plasma having a density gradient in order to accelerate ions, thereby producing a flow of energetic ions and neutral parties. The plasma gradient is produced by applying a non-uniform magnetic field to the plasma and/or providing non-uniform RF power to the plasma. Since the voltage within a plasma (i.e. the plasma potential) is dependent upon the density of the plasma, the plasma gradient produces an electric field within the plasma, which can be used to accelerate ions e.g., toward a substrate. This technique produces accelerated particles of lower energy than conventional systems, thereby causing less damage to a work piece being processed. In addition, since the ions accelerated by the apparatus have lower speeds than those accelerated by conventional systems, a larger proportion of the ions having time to recombine with free electrons before striking the work piece being processed. Since neutral particles are less damaging than ions, the amount of damage caused by the beam of accelerated particles is reduced further. As a result, manufacturing yields are increased, manufacturing costs are decreased, and improved lithographic resolution is possible, thereby improving performance and reducing the costs of circuits fabricated on a substrate.

31 Claims, 9 Drawing Sheets

APPARATUS AND METHOD FOR UTILIZING A PLASMA DENSITY GRADIENT TO PRODUCE A FLOW OF PARTICLES

CROSS-REFERENCE TO CO-PENDING APPLICATION

The present application is related to and claims priority to U.S. Provisional Application Ser. No. 60/061,857, filed Oct. 15, 1997. The contents of that provisional application are incorporated herein by reference.

BACKGROUND OF THE INVENTION

1. Field of the Invention

The invention relates to systems for providing a flow of particles in a plasma processing chamber, and particularly to systems for providing a flow of reactive and/or energetic particles for processing a substrate. The method and system are preferably used during poly or metal etch.

2. Discussion of the Background Art

Figure 1:
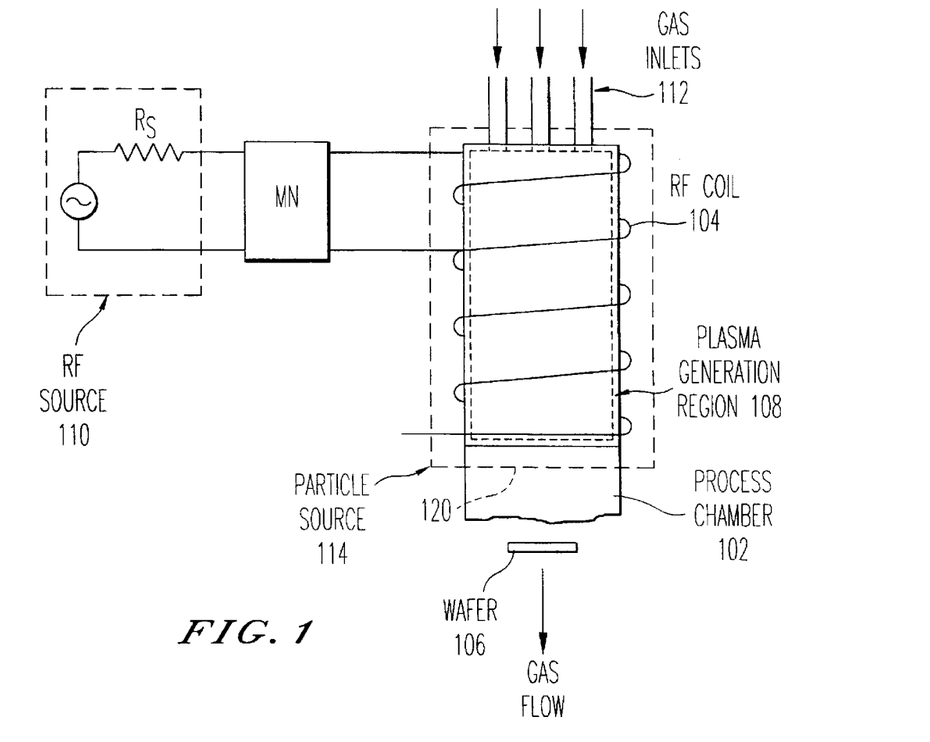
FIG. 1 is a schematic illustration of an example of an inductively driven plasma system.

In many electrical device and solid state manufacturing processes, energetic-charged or energetic-neutral gas particles are used to process a substrate, such as a semiconductor wafer. In one implementation, the particles can be supplied by a plasma which is generated in a gas within a particle source powered by an inductive or a capacitive plasma coupling element. FIG. 1 illustrates an exemplary plasma processing system including an inductive plasma coupling element, i.e., helical RF coil 104. One known inductive plasma generating system is disclosed in U.S. Pat. No. 5,234,529, issued to Wayne L. Johnson, the inventor of the present application. The contents of that patent are incorporated herein by reference.

As illustrated in FIG. 1, gas is supplied to a process chamber 102 through gas inlets 112. An RF power source 110 having an output impedance $R_S$ supplies RF power to a plasma coupling element (e.g., RF coil 104) which, in turn, ionizes the gas, exciting it into a plasma state within a particular region (plasma generation region 108) of the process chamber 102. The RF power can, optionally, be coupled into the plasma coupling element through an impedance matching network (MN). The resulting plasma produces charged particles (i.e., ions and electrons) and neutral particles (neutral atoms or molecules). In some configurations, particles are accelerated by applying a voltage to a chuck on which a substrate (e.g., wafer 106) is mounted. The accelerated particles are emitted at the output 120 of the particle source 114. The particles are used to process, or facilitate the processing of, the substrate 106. For example, the particles can be used for ion-assisted deposition (IAD) or reactive ion-etching (RIE).

Figure 2:
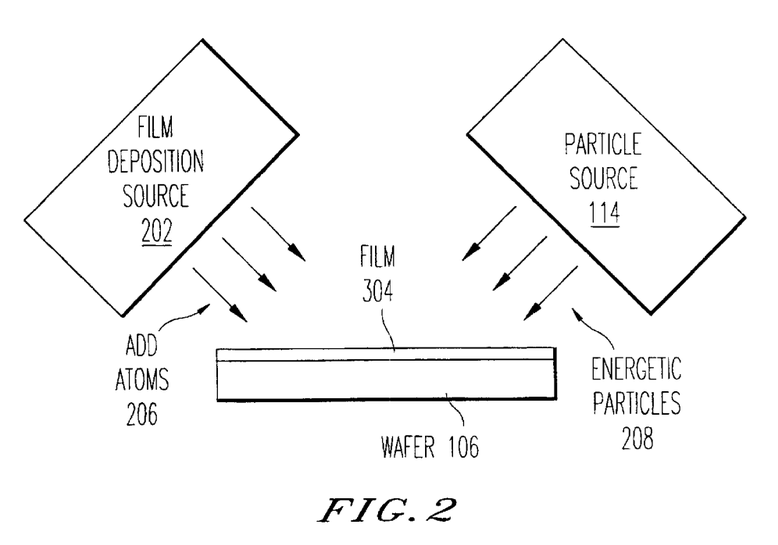
FIG. 2 is a schematic illustration of an Ion Assisted Deposition (IAD) system.

FIG. 2 schematically represents an example of a deposition system in which a film 304 is deposited on a substrate such as a wafer 106 by providing "add atoms" 206 (i.e., atoms deposited, or "added," to form the film) from a film deposition source 202 (e.g., an evaporation source or a sputtering source). A flow of energetic particles 208 from a particle source 114 is directed toward the substrate 106 during deposition, and the particles 208 collide with the add atoms 206, thereby supplying energy to the add atoms. The energetic ions 208 increase the energy of the add atoms 206, thus add atoms 206 have higher mobility on the surface of the substrate 106. Accordingly, the add atoms 206 are more likely to settle and adhere to a region of low energy (e.g., a location in the film 304 where there is a void in a solid material). Increasing the energy of the add atoms 206 has the benefit of producing films of higher quality. For example, the films have higher density, larger grains, and fewer defects. Higher density films can be advantageous because they provide: (a) higher conductivity (in the case of conductive materials), and (b) conductivity which is more stable with respect to time. Dielectric films produced by this method have dielectric constants closer to solid density dielectric constants and have increased dielectric strength.

Although the energy of the add atoms can be increased by raising the substrate temperature, IAD reduces the need for raising the substrate temperature. In fact, ion bombardment, which adds an average of one electron volt (eV) of energy per add atom, has an effect comparable to increasing the substrate temperature by approximately 200° C. The effectiveness of IAD can be increased further by supplying additional energy to the add atoms.

However, the addition of too much energy may have serious drawbacks on the processed substrates. If very high-energy atoms are used, the film can be damaged. For example, conventional ion sources for IAD provide ions having thousands of electron volts. Utilizing such high-energy ions has the disadvantage that it can cause implantation of the ions within the film. Implantation causes absorption of processing gases (e.g., argon used to provide the ions), which can deteriorate the films. Deterioration is caused (1) by reducing the density of the film, (2) by reducing the average grain size of the material in the film, or (3) by introducing additional defects into the film. Further, the addition of deeply implanted particles does not contribute to the desired mobility.

Reactive ion-etching can be used as part of a lithographic process for fabricating electronic circuits. An RIE process is described in *Microchip Fabrication—A Practical Guide to Semiconductor Processing*, by Peter Van Zant, and published by McGraw-Hill, Inc. The contents of the second and third editions of Van Zant are incorporated herein by reference. As designs become more compact across the horizontal plane of the substrate (i.e., in the x and y directions), and as designs increase in complexity, additional metalization layers are added (i.e., in the z direction). This change creates a need to process contact gaps and vias of varying heights and with higher aspect ratios. A description of the problems involved is discussed in the article entitled "The Interconnect Challenge: Filling Small, High Aspect Ratio Contact Holes," published in the August 1994 edition of *Semiconductor International* magazine. The contents of this article are incorporated herein by reference.

Figure 3A:
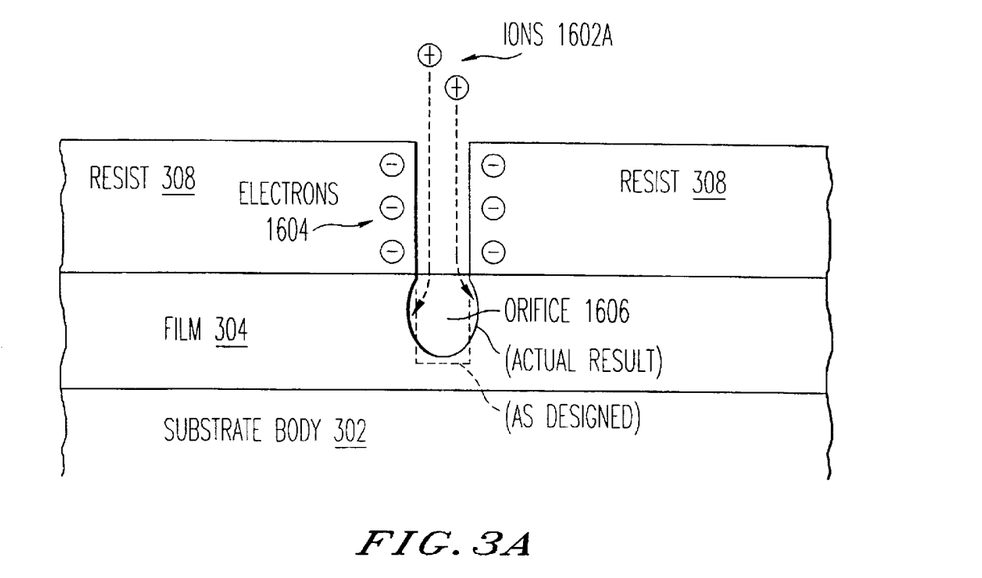
FIGS. 3A and 3B are schematic illustrations portraying etching processes for patterning films using energetic ions and energetic-neutral particles, respectively.

In known reactive ion etching systems, a film of material to be etched is first grown (e.g., by oxidation) or deposited (e.g., by sputtering or evaporation) on a substrate. A layer of resist is deposited on the film and developed into a desired pattern to form an etching mask, resulting in the structure shown in FIG. 3A. The substrate (e.g., a wafer) is then processed with ions 1602A generated by a plasma within a particle source in order to etch the film. Etching uncovers the substrate in the regions where etching is occurring, thereby leaving a patterned film on the substrate. The resist 308 is then removed (e.g., by using an oxide plasma), leaving a bare, patterned film. FIG. 3A depicts the processing of a substrate which includes a film 304 on a substrate body 302. The film 304 is etched by accelerated ions 1602A from a conventional particle source in order to form a narrow orifice or slot 1606. As the etching proceeds, electrons 1604 are attracted to, and adhere to, the resist layer 308, thereby defocusing the beam of ions 1602A and undesirably widening the orifice 1606 by side etching. In addition, the above-described side etching can cause narrowing of solid features such as conductive traces.

Since conventional sources of reactive particles produce ions with thousands of eV of energy, the etching selectivity of an etching process can be diminished (i.e., the process can undesirably etch the resist during etching of the grown or deposited film). In severe cases, high-energy particles can erode the resist enough to expose and undesirably etch portions of the film not intended for etching. Often, the resist is eroded near the edges of a feature, causing the feature to be reduced with respect to its intended size. Consequently, this can reduce the manufacturability of high-resolution patterns containing small features. Furthermore, high-energy particles can become implanted in the substrate body, or in a lower film beneath the film being etched, thereby degrading the electrical properties of the substrate body or the lower film.

Although the present invention is preferably applied to poly and metal etch processes, analogous problems exist when etching high aspect ratio holes in dielectric materials such as silicon dioxide. The process of etching high aspect ratio holes is further discussed in U.S. Pat. No. 5,468,339 to Gupta et al., entitled "Plasma Etch Process" in which 10:1 aspect ratios are described; in U.S. Pat. No. 5,468,340 to Gupta et al., entitled "Highly Selective High Aspect Ratio Oxide Etch Method and Products Made by the Process"; in U.S. Pat. No. 5,428,243 to Wylie, entitled "Bipolar Transistor with a Self-Aligned Heavily Doped Collector Region and Base Link Regions" in which holes of different depth are etched simultaneously; and in U.S. Pat. No. 4,717,448 to Cox et al., entitled "Reactive Ion Etch Chemistry for Providing Deep Vertical Trenches in Semiconductor Substrates." The contents of these patents are incorporated herein by reference.

A relatively recent source of extensive information on ion sources is the special issue of the *Review of Scientific Instruments*, Vol. 61, No. 1, Part II, January 1990. Moreover, Kaufman (U.S. Pat. No. 3,156,090) describes a two-grid ion source intended for use as an ion rocket engine and includes a neutralizer filament. Ikeda et al. (U.S. Pat. No. 4,243,1981) describe a parallel planar etching apparatus in which a first electrode includes a metallic mesh and a second electrode is a metallic plate. The target is placed outside the mesh electrode. Some of the plasma "leaks down through the meshes of the mesh electrode" and contacts the surface of a target. Harper and Kaufman (U.S. Pat. No. 4,259,145) describe a single extraction grid to form an ion beam with ion energies in the range from 10 to 100 eV. Cuomo and Harper (U.S. Pat. No. 4,351,712) describe an ion source, similar to the source described by Harper & Kaufman, with an ion energy source range between 30 and 180 eV. Ono and Matsuo (U.S. Pat. No. 4,450,032) describe an ion source resembling a shower head. The accelerating voltage is in the range from 200 to 1000 volts. Matsuo and Ono (U.S. Pat. No. 4,492,620) describe an adaption of the apparatus described in U.S. Pat. No. 4,450,031 which is modified to include an acceleration voltage as low as 100 V. Keller and Coultas (U.S. Pat. No. 5,206,516) use a three-electrode electrode decelerator lens to obtain a 25 eV ion beam from a much more energetic beam.

"A Laboratory Simulation of the Ionospheric Plasma" by Pigache, AIAA Journ., 11 (2), pp. 129–30 (1973) describes a plasma wind tunnel that includes a single-grid 20 eV ion source. "Ion Beam Divergence Characteristics of Two-Grid Accelerator Systems" by Aston et al., AIAA Journ. 16 (5), pp. 516–24, (1978) report on the "first comprehensive investigation of two-grid accelerator systems." "Ion Milling for Semiconductor Production Processes" by Bollinger, Solid State Technology, pp. 66–70, (1977) discusses ion milling within the context of semiconductor processing in an early general article. "Low Energy Ion Beam Etching" by Harper et al., J Electrochem Soc: Solid-State, 128 (5), pp. 1077–83, (1981) describe a single-grid ion source with beam energy less than 100 eV. "Ion Sources for Ion Machining Operations" by Kaufman et al., AIAA Journ., 15 (6), pp. 843–47, (1977) treat ion sources for industrial milling. "Technology of Ion Beam Sources Used in Sputtering" by Kaufman, J. Vac. Sci. Technology, 15 (2), pp. 272–6, (1978) treats the use of ion beams for sputtering. "Broad-Beam Ion Sources" by Kaufman, Rev. Sci. Instrum., 61 (1), pp. 230–5, (1990) discusses the technology of broad-beam ion sources. Both gridded and grid-less ion sources are considered.

Tsuchimoto (U.S. Pat. No. 4,123,316) discloses a plasma processor in which plasma diffuses from a plasma generating chamber through a plasma output port into a plasma processing chamber. The distance from the plasma output port to a target wafer is to be less than the mean free path of the gas remaining in the processing chamber. For deposition procedures, the potential differences between the plasma within the plasma generating chamber and a target wafer may be only a few volts. "Plasma Stream Transport Method . . . " by Tsuchimoto, J. Vac. Sci. Technology, 15 (1), pp. 70–3 (1978) describes a plasma source from which the plasma effuses with thermal velocity to a target. The plasma stream is confined by a coaxial magnetic field. A later article by Tsuchimoto entitled "Plasma Stream Transport Method . . . ", 15 (5), pp. 1730–3, (1978) considers neutralization of the plasma stream described in his earlier (15 (1)) article. "Operation Modes and Its Optical Measurements of Plasma Stream Transport . . . " by Tsuchimoto, 17 (6), pp. 1336–40, (1980) presents additional details. Cuomo and Kaufman (U.S. Pat. No. 4,451,890) describe a Hall ion generator that produces a self-neutralizing low energy, high intensity ion beam. The anode-cathode potential difference is in the range from 30 to 50 volts.

Lee et al. (U.S. Pat. No. 4,652,795) disclose passing a plasma out of the plasma generating chamber through a large aperture. Anode and cathode voltages are independently variable. Sekiguchi and Mito (U.S. Pat. No. 4,664,747) describe an RF or microwave plasma generator in which radiation and/or active species from the plasma are conducted to a target positioned outside the plasma discharge space. A mesh extraction electrode may be used, but configurations with no extraction electrode are also considered. Zarowin and Bollinger (U.S. Pat. No. 5,290,382) describe an RF or microwave excited inductively coupled plasma generator with an outlet port through which the plasma flows downstream from the plasma chamber to a substrate. An "interactive flange" provides a surface separate from the substrate to consume the active species and thereby controls the effective beams cross-section.

Chen et al. (U.S. Pat. No. 5,469,955) disclose a multichambered apparatus with which a neutral beam may be produced. A plasma is produced in an RF plasma generation chamber and, downstream, the plasma diffuses through a large aperture into a quiescent plasma chamber. A pseudo-neutral beam is produced in a third chamber. A particle energy "below that which causes crystal lattice damage in semiconductor materials" is possible. "Formation of MOS Gates by Rapid Thermal/Microwave Remote Plasma Processes . . . " by Moslehi, IEEE Electron Device Letters, EDL 8 (9), pp. 421–4, (1987) describes a system in which a plasma is generated in a microwave cavity. The remote microwave plasma allows selective, controlled generation of specific plasma species.

Rogoff (U.S. Pat. No. 4,090,856) separates isotopes by first selectively ionizing one isotope in a partially bounded region. Ambipolar diffusion of the charged isotope toward the enclosure walls occurs. The gas adjacent to the boundary, enriched in the desired isotope, is substantially neutralized at the walls and is then separated from the remaining mixture. Chen (U.S. Pat. No. 4,297,191), and Bridges (U.S. Pat. Nos. 4,545,878 and 4,563,258) are similar.

Accordingly, there is a need for an apparatus and method which can provide lowenergy ions and neutral particles. In particular, it is necessary to provide a flow of particles with energies significantly less than 1,000 eV, in order to process a substrate without damaging either the substrate or films on the substrate.

SUMMARY OF THE INVENTION

It is therefore an object of the invention to provide a system and method which can provide low-energy particle beams for processing a substrate.

In accordance with one aspect of the invention, a plasma with a density gradient is utilized to accelerate ions. In particular, a particle source according to the invention can be configured to produce ions having a desired energy and, therefore, a desired speed and/or selectivity. If the chosen ion speed is low enough and the distance between a substrate being processed and the particle source is large enough, the ions can have sufficient time to recombine with free electrons (i.e., electrons which are not bound to atoms) before striking the substrate, thereby producing accelerated (i.e., energetic) neutral particles. This combination process occurs in a charge exchange region of the processing system.

According to an advantageous aspect of the invention, a plasma density gradient is produced by applying a non-uniform magnetic field to the plasma. Since the density $n_P$ of a plasma is dependent upon the magnetic field applied to it, a magnetic field with a gradient can be used to provide a plasma with a density gradient. The plasma density gradient produces an electric field, thereby creating a voltage between (1) where ions are created and (2) where they exit the particle source. This voltage, in turn, accelerates the ions. The energy of the ions is dependent upon the voltage induced by the electric field produced by the plasma density gradient. The energy is later passed in a charge exchange process when a charged ion hits a neutral ion.

According to another advantageous aspect of the invention, non-uniform RF power is applied to the plasma, thereby producing a non-uniform plasma density $n_p$ which, in turn, produces an electric field (and a voltage associated with the electric field) in order to accelerate ions.

It is yet another object of the present invention to reduce the coupling effect between the RF source and the ions in a plasma. By reducing the coupling through RF shielding, ions are more easily directed down toward a processing area. This enables a greater wafer processing uniformity. Likewise, by providing a density gradient, it is also possible to produce particle acceleration without using a biased chuck. This change simplifies the system by reducing the amount of cooperative control that is needed between a first RF source applied to the RF coil and a second RF source applied to the chuck. This simplification reduces a cost of the overall system.

The invention uses a plasma density gradient to provide a flow of particles that can be used to process a substrate. The system utilizes a high density (i.e., a large number of particles per unit volume) stream of low-energy particles to process the substrate as effectively as a low density stream of high-energy particles. Moreover, the high density stream causes less damage than the low-density stream of high-energy particles. Thus, the present invention overcomes deficiencies in conventional systems and provides significant benefits, e.g., by improving the quality of deposited films. More specifically, (1) improved film morphology (e.g., less hillock formation) can be obtained, (2) higher and more stable values of conductivity can be obtained in conducting layers, and (3) electromigration effects can be reduced. Furthermore, substrate damage during etching of films can be reduced, resulting in fewer device defects. As a result, manufacturing yield is increased and manufacturing costs are reduced.

BRIEF DESCRIPTION OF THE DRAWINGS

A more complete appreciation of the invention and many of the attendant advantages thereof will become readily apparent to those skilled in the art when the following detailed description is considered in conjunction with the accompanying drawings, in which.

DESCRIPTION OF THE PREFERRED EMBODIMENTS

Figure 4:
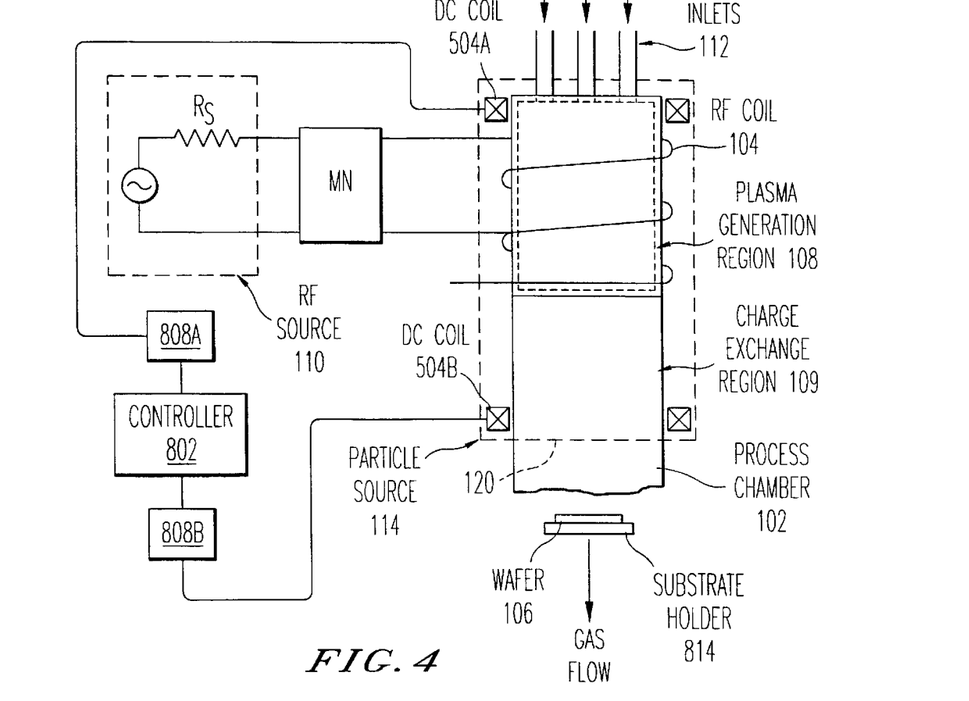
FIG. 4 is a schematic illustration of a first embodiment of a plasma processing system including magnetic field inducing coils to produce a magnetic field gradient according to the invention.

Referring now to the drawings, in which like reference numerals designate identical or corresponding parts throughout the several views, FIG. 4 is a schematic illustration of a processing plasma processing system according to the present invention. The system is similar to the conventional system described with reference to FIG. 1 and includes gas inlets 112, a process chamber 102 surrounded by an RF coil 104, and an RF source 110. The system further includes a controller 802 for controlling two current sources 808A and 808B to apply controllable currents to DC coils 504A and 504B. The process chamber conceptually includes two regions—a plasma generation region 108 and a charge exchange region 109. The ions produced in the plasma generation region 108 combine with free electrons in the charge exchange region 109 to produce neutral particles. In an alternate embodiment, the charge exchange region 109 enables a charged ion to exchange charge with a neutral atom, often of the same element. To produce an energetic stream of particles, the plasma is energized and a pressure gradient is established to coerce the energetic particles toward the wafer or substrate to be processed. However, the majority of the particle acceleration is caused by the magnetic fields created by the DC coils 504A and 504B. By making the process chamber 102 longer, higher energy particles can be produced because the energetic particles are accelerated for a longer distance (and thereby a longer period of time). The lengths of the plasma generation region 108 and the charge exchange region 109 can be varied to provide energetic particles of different energy to accommodate varying process requirements.

The particle source 114 of FIG. 2 can be used in a system of FIG. 4 configured as an Energetic Particle Assisted Deposition (EPAD) system. In such a system, a film deposition source 202 supplies "add atoms" 206 (i.e., atoms being deposited on, or "added" to, a substrate such as a wafer 106) in order to produce a film 304. The particle source 114 supplies energetic particles 208 to the film 304 as it grows, in order to provide the add atoms 206 with additional energy, thereby increasing their surface mobility on the wafer 106 and/or the film 304. The increased surface mobility of the add atoms improves the quality of the film 304. The energetic particles 208 can be accelerated ions, accelerated neutral particles, or a combination of both types of particles. Furthermore, in some cases it is preferable for a gas mixture supplied to the particle source 114 to contain non-reactive (i.e., inert) gas (e.g., argon) if, according to the process requirements, it is preferable for the energetic particles not to react with the add atoms 206 and/or the film 304.

For an EPAD system, a particle source 114 producing low energy neutrals is advantageous over conventional particle sources because it supplies particles having lower energy than particles produced by conventional sources. The low energy source thereby reduces the amount of damage that would otherwise be caused by implantation of high-energy ions and/or neutral particles. Since the particle source 114 of the invention is capable of providing significantly low-energy particles (e.g., less than 100 eV per add atom), the accelerated particles 208 of the invention are less likely to be implanted into the film 304 than higher-energy particles. The low-energy particle source 114 provides the benefits of EPAD and/or IAD (e.g., higher density, larger grains, and fewer defects), while avoiding excessive implantation of ions into the film. Furthermore, while some known systems require an additional RF source for biasing a substrate holder in order to accelerate particles, the particle source of the invention utilizes a density gradient to accelerate particles, thereby allowing the elimination of both (1) an additional RF source and (2) a matching network used to couple the RF source to the substrate holder. Further, by utilizing energetic particles with lower energies, the ions have more time to recombine with free electrons before reaching a substrate being processed. Consequently, a significant portion of the accelerated particles are neutral particles, which, compared to ions, cause less damage to a film or substrate.

Figure 3B:
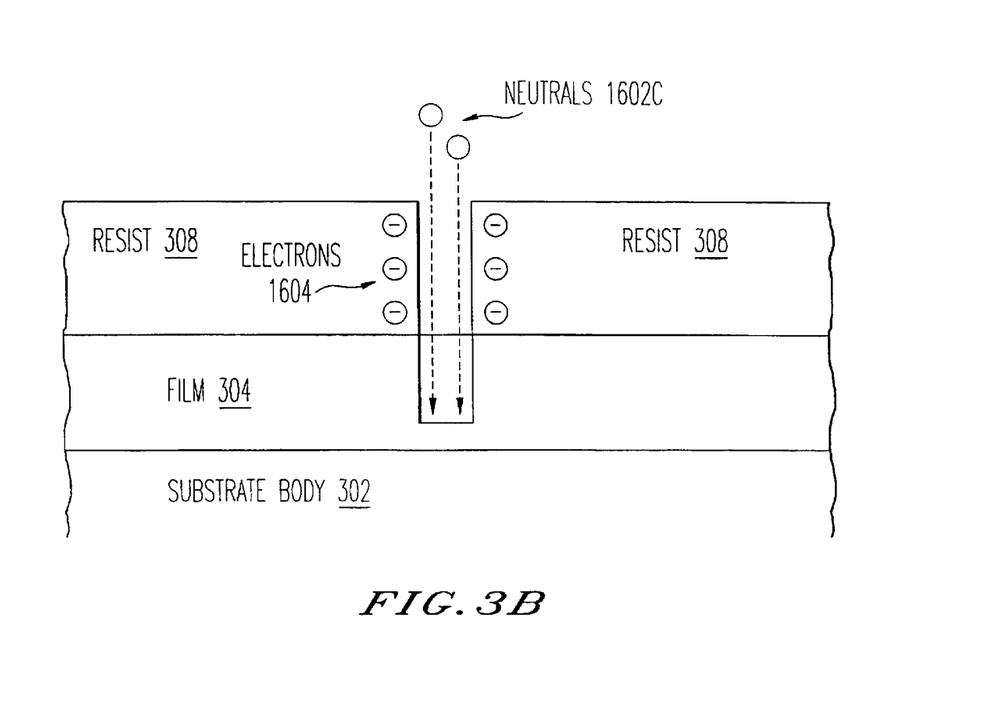

The particle source 114 of FIG. 2 can be used for the reactive etching process illustrated in FIG. 3B. According to the invention, the film 304 is etched by exposing it to a stream of energetic neutral particles 1602C produced by the particle source 114 in order to uncover portions of the substrate body 302. The gas mixture supplied to the particle source 114 preferably contains a reactive gas (e.g., Cl). The process has the advantages of both ion beam etching and plasma etching and produces a reactive ion etching system with a good selectivity ratio.

Since the particle source of the invention produces lower energy particles than some known sources, less damage is caused to the film 304, the substrate body 302, and the resist 308. By keeping the energy of the add atoms lower, less degradation of circuit performance is caused and improved manufacturability of high-resolution patterns is provided. Further, according to the invention, neutral particles 1602C are particularly advantageous for improving the resolution of the etching step of a lithographic process, as illustrated in FIG. 3B. The beam of neutral particles (i.e., neutral atoms and/or molecules) 1602C is not defocused by electrons 1604 which are attracted to the resist layer 308. Consequently, the film 304 is etched into a pattern more closely corresponding to the pattern of the resist 308. This enables the etching of smaller features with less side etching than in conventional systems. This provides the advantages of increased circuit densities and reduced device sizes. Increased densities provide more circuits per wafer, consequently reducing the cost of the circuits.

Figure 5:
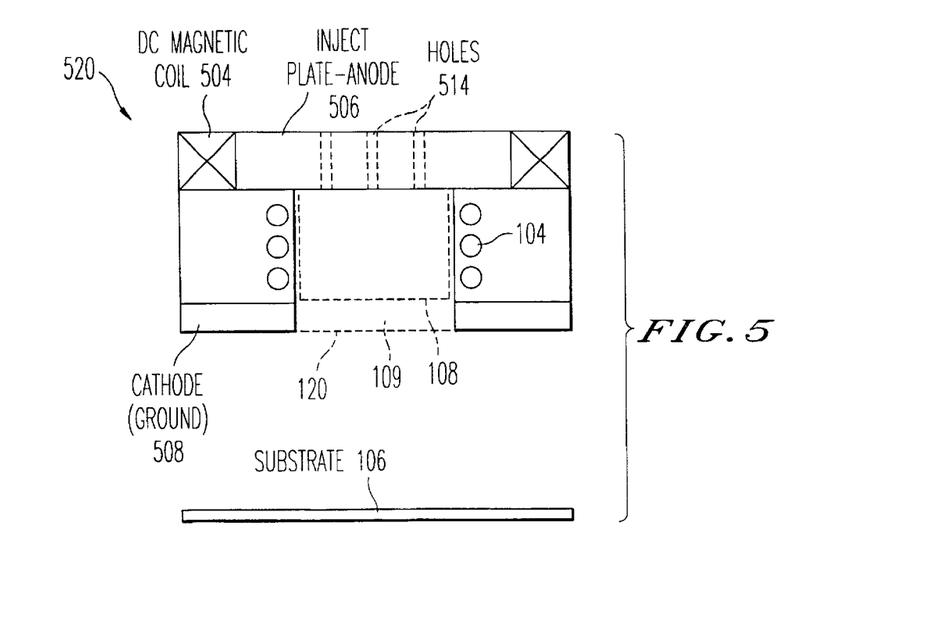
FIG. 5 is a schematic illustration of a device for providing a plasma with a density gradient in order to accelerate particles according to the invention.

FIG. 5 is a schematic illustration which shows additional details of the particle source 114 of FIG. 4. An accelerated particle source 520 is used to provide the particles that process a substrate 106 according to one embodiment of the invention. In this embodiment, a mixture of gas (either reactive or inert) is supplied by one or more tubes connected to one or more gas tanks and is introduced into the source 520 through holes 514 in an inject plate 506. RF power from an RF generator (not shown) is coupled into the source 520 through an inductive plasma coupling element 104 which is, in this embodiment, in the form of a helical coil. The RF power generates a plasma in a plasma generation region 108. A DC magnetic coil 504 (i.e., an electromagnet) provides a DC magnetic field which is more concentrated near the inject plate 506 and less concentrated near the output 120. More specifically, the DC magnetic coil 504 carries a current I and produces a magnetic field pattern similar to the pattern shown in FIG. 6A.

Figure 6A:
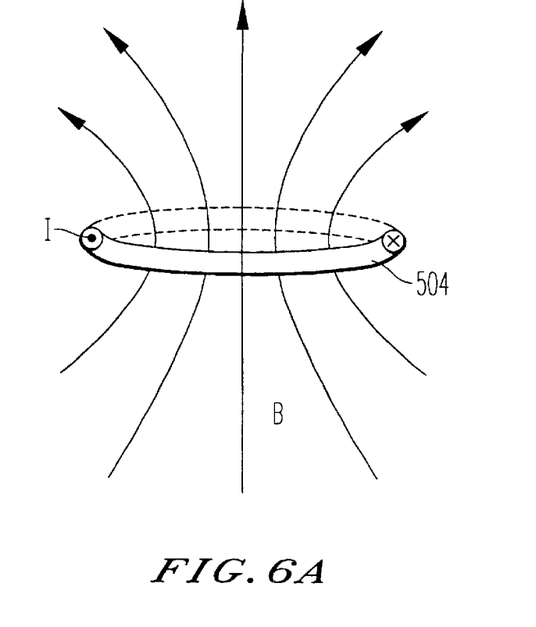
FIG. 6A is a schematic illustration of a magnetic field pattern of a single magnetic coil according to the invention.

As illustrated in FIG. 6A, a magnetic field tends to be strongest in the region closest to the coil 504. Due to the tendency of magnetic fields to trap electrons, a plasma tends to be denser in a region of stronger magnetic field. Consequently, since the magnetic field provided by the DC magnetic coil has a gradient (i.e., the field decreases in strength from the inject plate 506 of FIG. 5 to the output 120), the plasma is more concentrated near the inject plate 506 and less concentrated near the output 120 (i.e., the plasma density has a negative gradient from the inject plate 506 to the output 120).

A potential (i.e., a voltage) within a plasma is dependent upon plasma conditions such as plasma density np (i.e., the number of ion-electron pairs per unit volume), the particular gas mixture used to produce the plasma, applied magnetic fields, and applied electric fields. The plasma interacts with the walls of a chamber containing it by a process known as ambipolar diffusion, in which electrons are attracted to a surface, adhere to the surface and, in turn, attract ions to the surface. Ions, upon arriving at a surface with available electrons, recombine with the electrons to form neutral particles (i.e., neutral atoms and/or molecules). Depending upon, for example, whether more electrons or more positive ions adhere to the surface, the surface attains a net negative or positive surface charge. Consequently, electric fields are produced at the inner surfaces of the source 520 of FIG. 5, thereby generating a voltage which is dependent upon, e.g., the local plasma density. As a result, the gradient in plasma density within, and near, the source 520 causes a voltage difference to exist between the inject plate 506 and the substrate 106, thereby accelerating ions in the direction of the substrate 106.

Figure 7:
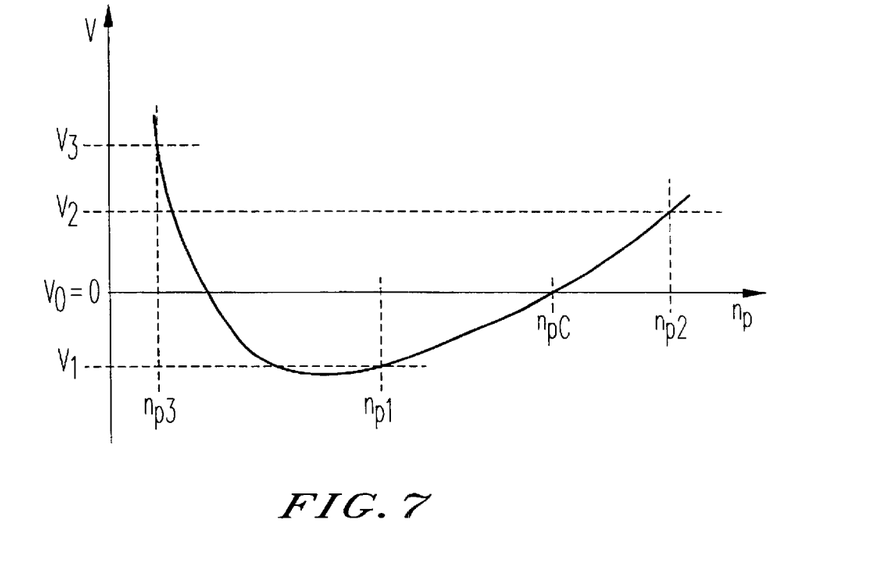
FIG. 7 is an exemplary graph of plasma voltage versus density of a plasma.

Illustratively, FIG. 7 is a graph representing an exemplary dependence of plasma voltage V on plasma density $n_P$. In that graph, as plasma density increases, the plasma potential V first decreases with increasing $n_Pp$, then reaches a minimum, and then begins to increase at higher levels of plasma density. Since V is dependent upon $n_P$, a gradient in plasma density produces an electric field which can be used to accelerate ions.

In the embodiment of FIG. 5, the DC magnetic field provided by the coil 504 causes the plasma to have a higher density (e.g., $n_{p2}$ of FIG. 7) at the portion of the plasma generation region 108 which is near the inject plate 506, and a lower density (e.g., $n_{pc}$, in FIG. 7) at the portion of the plasma generation region 108 which is near a cathode 508 (which is grounded), thereby causing a higher voltage (e.g., $V_2$, of FIG. 7) to exist at the inject plate 506 and a lower voltage (e.g., $V_C$, which equals 0, in FIG. 7) to exist at the cathode 508. Consequently, the inject plate 506 becomes self-biased (i.e., attains the voltage of the plasma surrounding it) with a positive voltage compared to the voltage of the cathode 508. The inject plate 506 therefore behaves as an anode. Furthermore, since the plasma density is decreased further for points outside of the plasma generation region 108, the plasma density (e.g., $n_{p1}$) near the substrate 106 is lower than the plasma density (e.g., $n_{pc}$) near the cathode 508. Therefore, according to this embodiment, the substrate 106 becomes negatively self-biased (e.g., V=$V_1$, in FIG. 7) with respect to the cathode 508. Consequently, positive ions are accelerated from the plasma region 108 to the substrate 106, thereby processing the substrate (e.g., etching a film on the substrate or contributing to an IAD process). Although, in this embodiment, the plasma density $n_{P1}$ near the substrate 106 results in a voltage ($V_1$) near the substrate which is lower than the voltages ($V_c$, $V_2$) near the cathode 508 and the inject plate/anode 506, it is to be understood that, in other cases, a still lower plasma density (e.g., $n_{p3}$, in FIG. 7) can, in fact, result in a higher voltage (e.g., $V_3$) which can be used to accelerate negative ions toward the substrate.

Figure 6B:
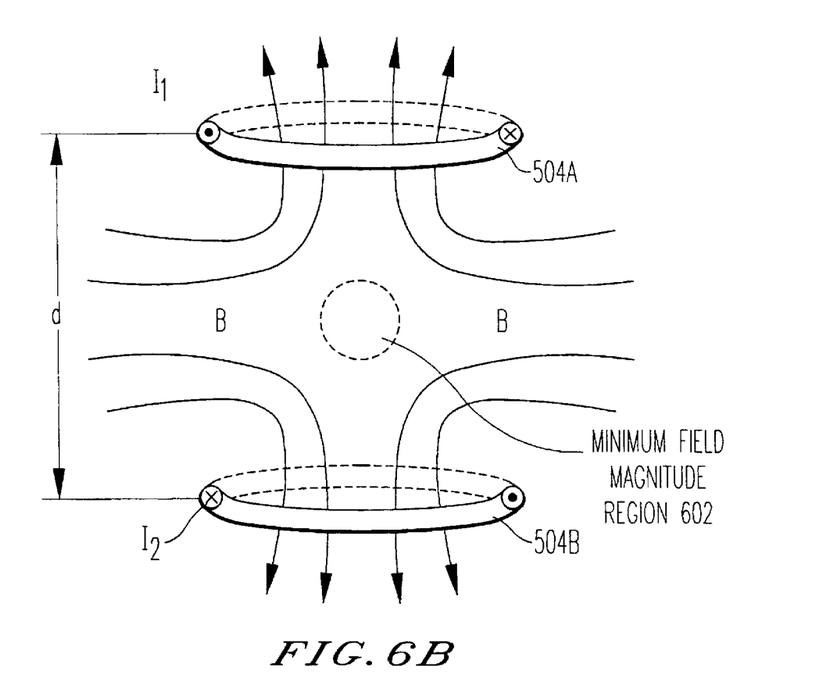
FIG. 6B is a schematic illustration of a magnetic field pattern produced by two coils with currents flowing in opposite directions.

The magnetic field gradient produced by a single DC coil such as the coil 504 of FIG. 5 can be enhanced by providing an additional DC coil (i.e., an electromagnet), with current flowing in an azimuthal direction opposite to that of the current of the first coil. An embodiment of this arrangement is illustrated schematically in FIG. 6B, and includes a first coil 504A with current $I_1$ flowing in one azimuthal direction and a second coil 504B with current $I_2$ flowing in the opposite azimuthal direction. The two coils 504A and 504B are disposed coaxially to each other and are separated by a distance d. This configuration, known as a "bucking coil," utilizes currents flowing in opposite directions. In the embodiment of FIG. 6B, the magnetic field B is oriented in an upward direction in the region closer to coil 504A and in a downward direction in the region closer to coil 504B. Approximately midway between the coils 504A and S04B, particularly in cases wherein $I_1$ and $I_2$ are nearly equal, the magnetic fields cancel within a minimum field magnitude region 602. In an alternate embodiment, Helmholtz coils (which have currents flowing in the same direction in both coils) may be used to provide an alternate magnetic field configuration.

Figure 6C:
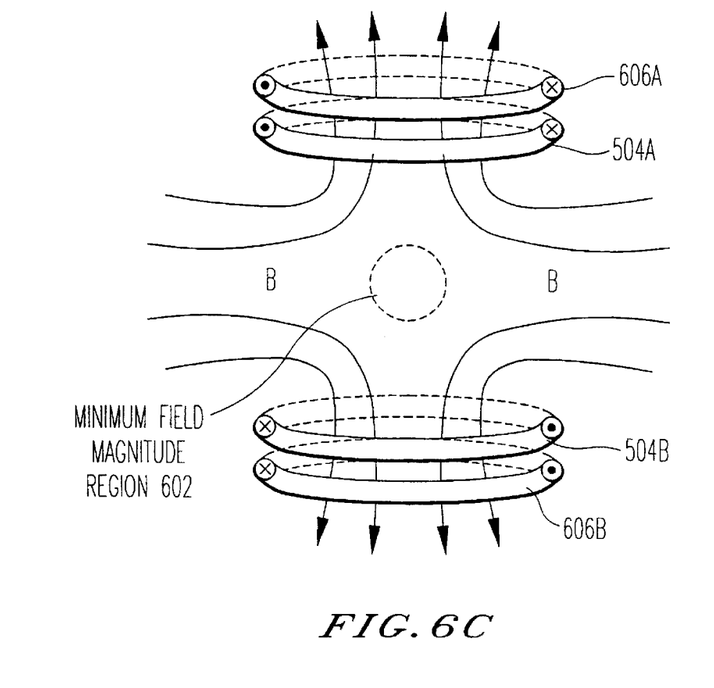
FIG. 6C is a schematic illustration of a magnetic field pattern produced by two pairs of coils, where the current in one pair is opposite in direction from the current in the second pair.

An embodiment of a bucking coil in accordance with the invention is illustrated in FIG. 6C. This arrangement includes trimming coils 606A and 606B in addition to coils 504A and 504B. The trimming coils 606A and 606B can be used to fine-tune the magnetic field B produced by the bucking coil. For example, since the magnetic fields of the four coils 504A, 504B, 606A, 606B cancel in a minimum field magnitude region 602, the location of the minimum field magnitude region can be moved by changing the current through one or more coils. More specifically, the current supplied to one or both of the trimming coils 606A, 606B can be changed, while maintaining a constant current in each of coils 504A and 504B.

Figure 6D:
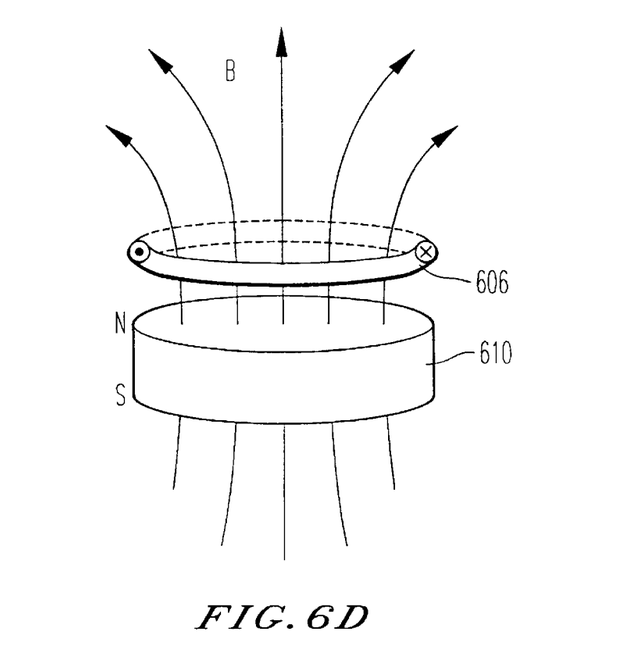
FIG. 6D is a schematic illustration of a magnetic field pattern of a permanent magnet, including a trimming coil, according to the invention.

According to an additional advantageous aspect of this feature of the invention, illustrated in FIG. 6D, a magnetic field B can be provided by a permanent magnet 610, which can replace the coil 504 of FIG. 6A or at least one of the coils 504A and 504B of FIG. 6B. In addition, as also illustrated in FIG. 6D, an arrangement for producing a magnetic field gradient using one or more permanent magnets can further include a trimming coil 606 to allow adjustment of the magnetic field provided by at least one permanent magnet 610. The permanent magnet 610 of FIG. 6D has a north pole N and a south pole S. In this embodiment, the north pole is disposed proximately to the trimming coil 606. Alternatively, the south pole can be disposed proximately to the trimming coil 606.

Figure 8:
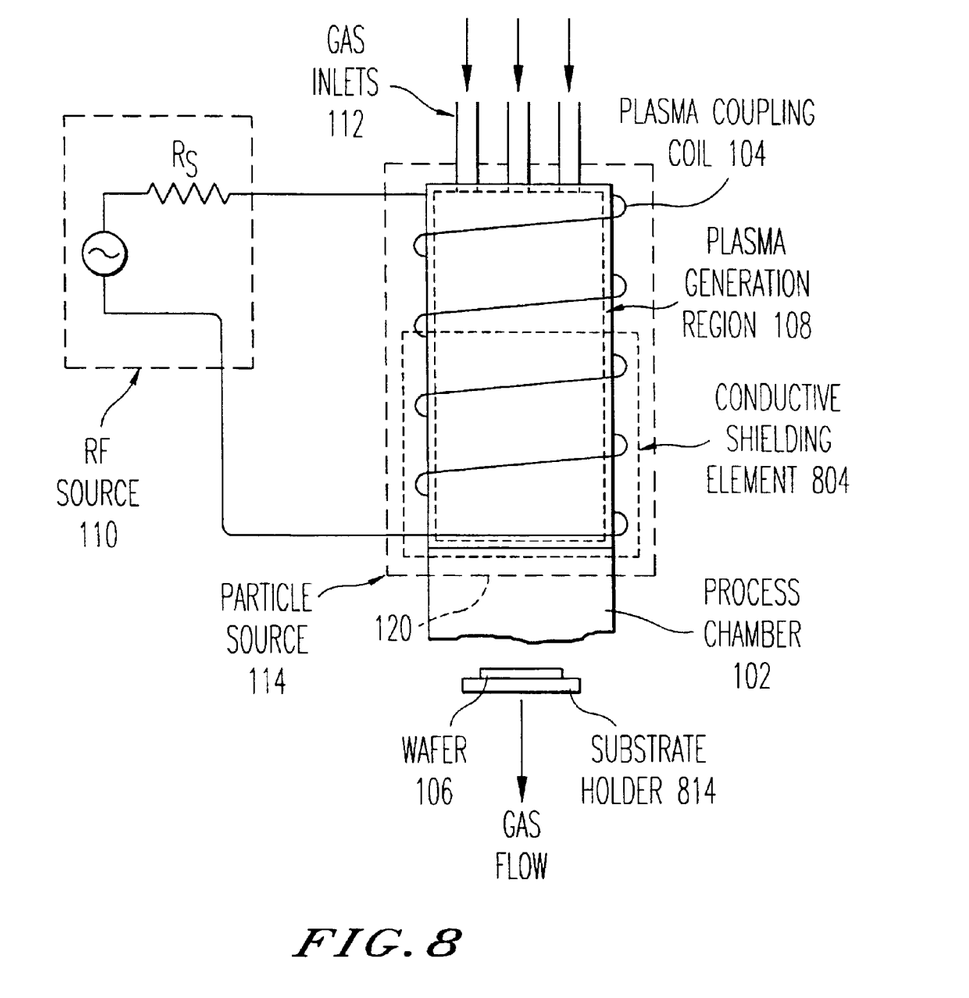
FIG. 8 is a schematic illustration of a second embodiment of a plasma processing system including a conductive shielding element to produce a density gradient according to the invention.

FIG. 8 is a schematic illustration of an alternate embodiment of a plasma processing system according to the present invention. This embodiment replaces the DC coils 504A and 504B of the embodiment of FIG. 4 with a conductive shielding element (or "electrostatic shield") 804. The conductive shielding element 804 shields a portion of the plasma generation region 108, thereby reducing the density of plasma in the region enclosed by the conductive shielding element 804. In this embodiment, the conductive shielding element 804 is in the form of a hollow cylinder which is open at the top and the bottom. The height of the conductive shielding element 804 is dictated by the type of processing to be performed on the wafer 106. By reducing the amount of RF power coupled to the lower portion of the plasma generation region 108, while not greatly changing the amount of RF power coupled to the upper portion of the plasma generation region, the conductive shielding element 804 causes a density gradient in the plasma. As shown, a higher density is produced at the upper portion of the plasma generation region 108 as compared to the lower portion of the plasma generation region 108. Consequently, a voltage is produced from the top to the bottom of the plasma generation region 108, thereby accelerating ions toward the output 120 of the particle source 114. The accelerated ions, as well as accelerated neutral particles produced by recombination of the accelerated ions, are used to process a wafer 106 which can be held by, or affixed to, a substrate holder 814 (e.g., an electrostatic chuck). Although the conductive shielding element 804 of FIG. 8 encloses the bottom portion of the plasma generation region 108, a conductive shielding element in accordance with the invention can, alternatively, enclose the top of the plasma generation region 108, thereby causing the plasma density to be higher within the lower portion of the plasma generation region and lower within the higher portion of the plasma generation region. In cases of higher density within either the upper or the lower portion of the plasma, a voltage of either positive or negative polarity can exist from the upper to the lower portion. For example, as illustrated in FIG. 7, a lower plasma density (e.g., $n_{p3}$) can produce a voltage (e.g., $V_3$) which is greater than the voltage (e.g., $V_1$) produced by a higher plasma density (e.g., $n_{p1}$). Alternatively, a higher plasma density (e.g, $n_{p2}$) can produce a voltage (e.g., $V_2$) which is greater than a voltage (e.g., $V_1$) produced by a lower plasma density (e.g., $n_{p1}$).

Figure 9:
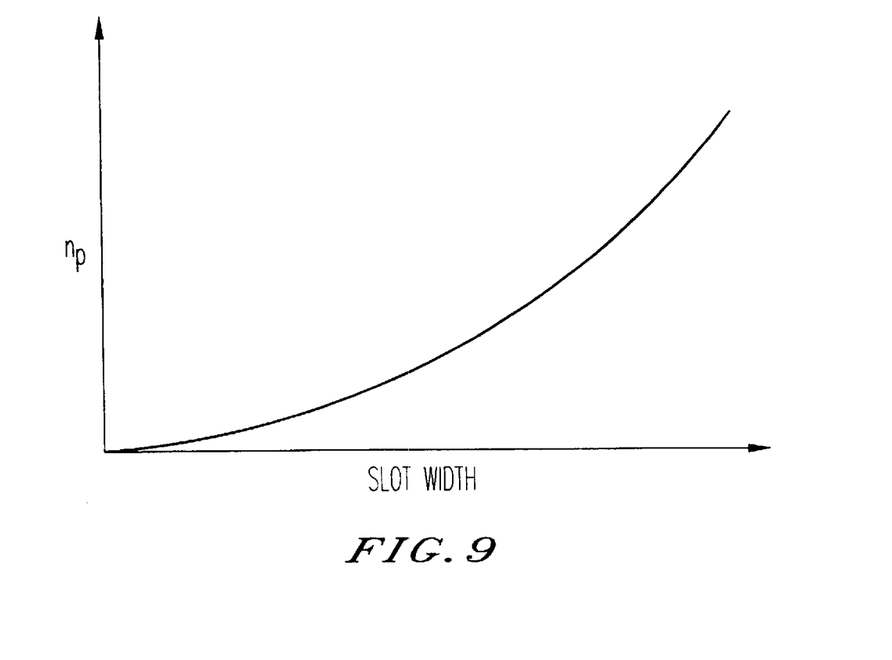
FIG. 9 is a graph of plasma density versus slot width in a conductive shielding element.

In addition, according to the invention, the conductive shielding element 804 can be provided with one or more slots to interrupt circulating currents induced in the conductive shielding element by the RF power, and to provide capacitive coupling between an inductive plasma coupling element and the plasma. The slots can be used to adjust the amount of RF power coupled to a plasma and, therefore, the density $n_p$ of a particular portion of the plasma. As illustrated in FIG. 9, plasma density $n_p$ near a slot tends to increase with the width of the slot. Furthermore, the plasma density within a plasma can be non-uniform, and the non-uniformity can be influenced by the shape of the slot, as illustrated in Figures 10A–10C.

Figure 10A:
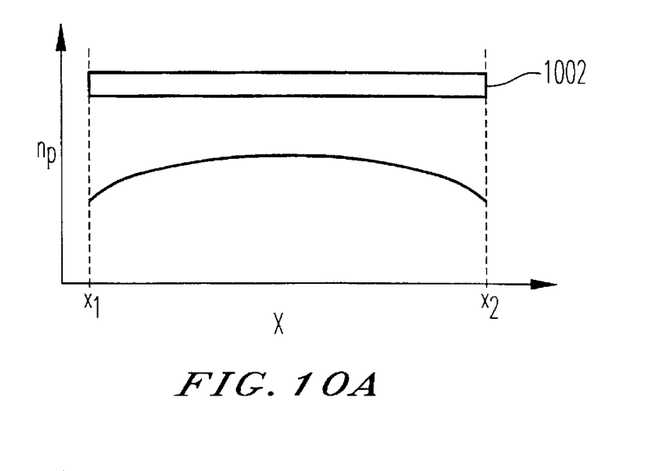
FIG. 10A is a schematic illustration of an example of a conductive shielding element having tapered slots for producing a plasma density gradient according to the invention.
Figure 10B:
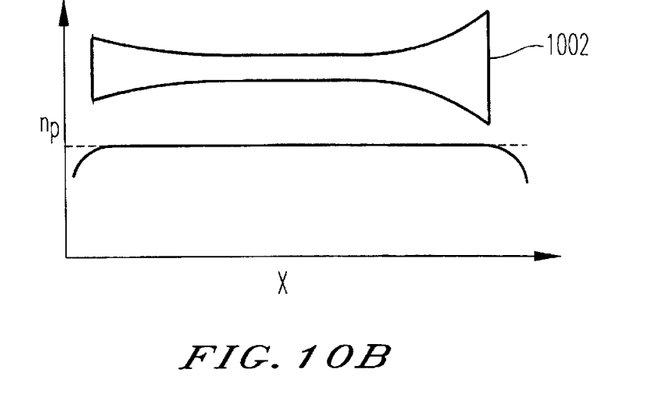
FIG. 10B is a schematic illustration of an example of a conductive shielding element having non-linearly tapered slots for producing a plasma density gradient according to the invention.

For example, as illustrated in FIG. 10A, a slot 1002 of uniform width produces a plasma density $n_p$ which varies with location x along the slot. In this case, $n_p$ is lower near the ends ($x=x_1$ and $x=x_2$) of the slot 1002. A uniform plasma density $n_p$ can be produced within a portion of a plasma by providing a slot 1002 of non-uniform width, as illustrated in FIG. 10B, which portrays such a slot along with a profile of plasma density $n_p$ versus location x along the slot. In the embodiment of FIG. 10B, the plasma density $n_p$ is relatively uniform near the center portion of the slot, and only becomes non-uniform near the edges of the slot. Alternatively, in order to produce a plasma with a density gradient in one direction, a tapered slot can be provided, as illustrated in FIG. 10C. In the embodiment shown in this drawing, the plasma density $n_P$ is greater near the wide portion of the slot 1002 and smaller near the narrow portion of the slot.

Figure 10C:
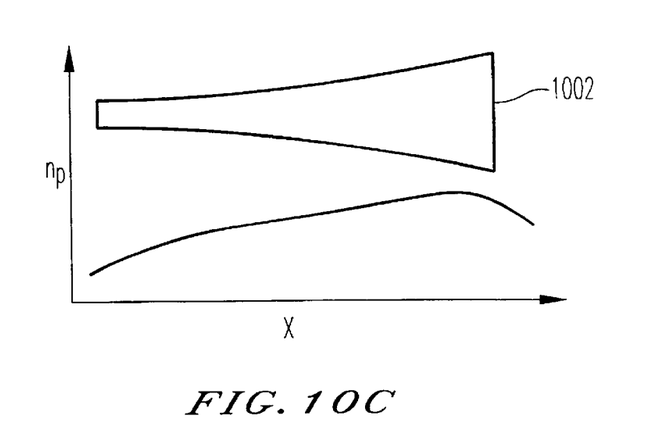
FIG. 10C is a schematic illustration of an example of a conductive shielding element having adjustable tapered slots for producing a plasma density gradient according to the invention.
Figure 11A:
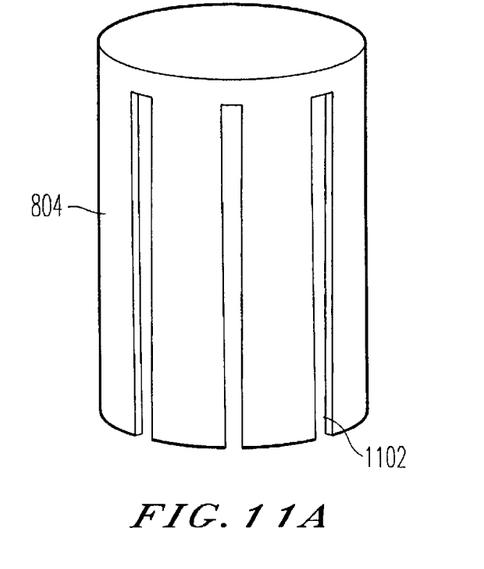
FIG. 11A is an exemplary graph of plasma density versus location along a slot of uniform width of a conductive shielding element.
Figure 11B:
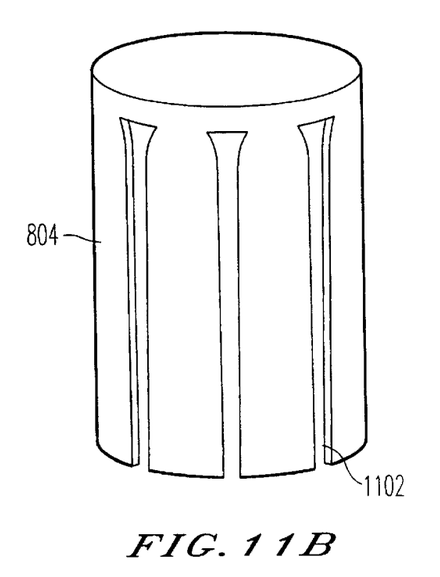
FIG. 11B is an exemplary graph of plasma density versus location along a slot of a conductive shielding element, wherein the slot has a non-linear taper in order to provide a uniform plasma density.

A tapered slot such as that shown in FIG. 10C can be provided as a feature of a conductive shielding element 804, as illustrated in FIG. 11A. This conductive shielding element 804 can be utilized in the particle source 114 of FIG. 8 in order to provide a gradient of plasma density. The shield 804 of FIG. 11A is long enough to enclose the entire plasma generation region 108 while still producing a plasma density gradient due to the tapered geometry of the slots 1102. In another embodiment, the shield 804 is shorter. The conductive shielding element 804 of FIG. 11B is provided with slots 1102 having a curved taper. Depending on the desired profile of plasma density, the slots 1102 can be formed in variety of different geometries.

For example, the slots 1102 (FIGS. 11A and 11B) can, optionally, be narrower at the top of the shield 804 and wider at the bottom of the shield in order to produce values of $n_p$ which are lower at the top of the shield and higher at the bottom. Depending on the particular density profile of the plasma resulting from the geometry of the slots, either a positive or a negative voltage can exist from the top to the bottom of the shield 804, as can be better understood by referring to FIG. 7. If, for example, the plasma density is $n_{p2}$ at the top of a shield, and $n_{p1}$ (which is less than $n_{p2}$) at the bottom, then, as can be readily seen by examining the exemplary V vs. $n_p$ curve of FIG. 7, there is a positive voltage from the top to the bottom of the shield. If, however, the plasma density is $n_{p1}$ at the top of the shield and $n_{p3}$ (which is less than $n_{p1}$) at the bottom, then there is a negative voltage from the top to the bottom of the shield.

Figure 11C:
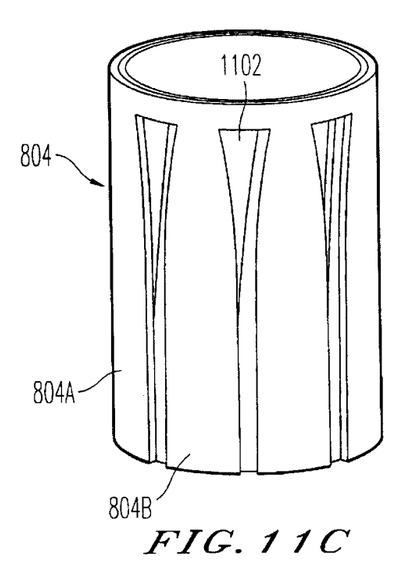
FIG. 11C is an exemplary graph of plasma density versus location along a tapered slot of a conductive shielding element which produces a plasma density gradient in one direction according to the invention.

According to an additional aspect of this feature of the invention, in an alternate embodiment, slots 1102 are adjustable, as illustrated in FIG. 11C. The conductive shielding element 804 of FIG. 11C includes two independent components 804A and 804B, which rotate with respect to each other, thereby adjusting the sizes and/or geometries of the slots 1102. This configuration is particularly advantageous for particle sources which are designed to be utilized in a variety of different processing systems. Since different processes require different densities and/or energies of accelerated particles, the conductive shielding element 804 of FIG. 11C is particularly advantageous because it allows the particle source to be adjusted for a particular process without replacing the conductive shielding element 804.

Although the above discussion has been provided in terms of a wafer 106 which is oriented in a direction perpendicular to the gas flow and the particle motion, other angles of orientation can be used without deviating from the scope of the invention. Furthermore, it is to be understood that, although the system of FIG. 4 includes a pair of electromagnets 504A and 504B which are similar to those illustrated in FIG. 6B, a processing system according to the invention can also include trimming coils such as the electromagnets 606A and 606B of FIG. 6C. In an alternate embodiment, one or both of coils 504A and 504B of FIG. 4 are replaced by one or more permanent magnets such as the magnet 610 of FIG. 6D.

The particle source of the invention utilizes a non-uniform magnetic field and/or non-uniform RF power to produce a gradient of plasma density, which can be used to provide a flow of low-energy ions and/or neutral particles, e.g., for processing substrates. Low-energy accelerated particles are advantageous over the high-energy particles produced by conventional particle sources because they cause less damage to the substrate being processed. Furthermore, since the particles produced by the particle source of the invention have lower speeds than those produced by conventional systems, a larger portion of ions have sufficient time to recombine with electrons and become accelerated neutral particles before striking the substrate. The neutral particles are advantageous not only because they are likely to produce less substrate damage than ions, but also because they are less susceptible to defocusing by electrons which can adhere to a resist layer during etching. Reducing the defocusing effect provides improved resolution and manufacturability of smaller devices and circuits. The various features of the invention increase the manufacturing yield of plasma processes, reduce manufacturing costs, and provide smaller device sizes (thereby improving high-speed performance of circuits fabricated on a substrate).

Obviously, numerous modifications and variations of the present invention are possible in light of the above teachings. It is therefore to be understood that within the scope of the appended claims, the invention may be practiced otherwise than as specifically described herein.

What is claimed is:

1. An apparatus for producing accelerated particles, comprising:
   a chamber;
   a plasma generator for generating a plasma within said chamber; and
   means for providing a density gradient of said plasma to thereby accelerate particles, wherein said means for providing said gradient comprises a first conductive coil and a second conductive coil disposed coaxially to said first conductive coil, wherein a first current of said first conductive coil flows in a first azimuthal direction and a second current of said second conductive coil flows in a second azimuthal direction opposite to said first azimuthal direction.

2. The apparatus as claimed in claim 1, further comprising a permanent magnet.

3. The apparatus as claimed in claim 1, further comprising a substrate holder for holding a substrate to be processed by accelerated particles produced by said apparatus.

4. The apparatus as claimed in claim 3, further comprising means for depositing a film, such that accelerated particles produced by said apparatus collide with said film during deposition of said film on said substrate.

5. The apparatus as claimed in claim 3, further comprising means for providing reactive gas to said chamber in order to produce reactive accelerated particles that reactively etch a portion of said substrate.

6. The apparatus as claimed in claim 1, further comprising a recombination section for causing accelerated ions to recombine with electrons to produce accelerated neutral particles.

7. An apparatus for producing accelerated particles, comprising:
   a chamber;
   a power source;
   a plasma coupling element providing power from said power source to a plasma within said chamber; and
   means for providing a density gradient of said plasma to thereby accelerate particles, wherein said means for providing said density gradient comprises a conductive shielding element for reducing coupling to said plasma coupling element by a first portion of said plasma as compared to a second portion of said plasma.

8. The apparatus as claimed in claim 7, wherein said conductive shielding element includes at least one slot for increasing coupling of said second portion of plasma to said plasma coupling element.

9. The apparatus as claimed in claim 8, wherein said at least one slot comprises a taper that varies in width from one end of said at least one slot to another end of said at least one slot.

10. The apparatus as claimed in claim 8, wherein said at least one slot comprises a curved taper that varies nonlinearly in width from one end of said at least one slot to another end of said at least one slot.

11. The apparatus as claimed in claim 7, further comprising means for depositing a film, such that accelerated particles produced by said apparatus collide with said film during deposition of said film.

12. The apparatus as claimed in claim 7, further comprising means for providing reactive gas to said chamber in order to produce reactive accelerated particles that reactively etch a portion of said substrate.

13. The apparatus as claimed in claim 11, further comprising a recombination section for causing accelerated ions to recombine with electrons to produce accelerated neutral particles.

14. The apparatus as claimed in claim 12, further comprising a recombination section for causing accelerated ions to recombine with electrons to produce accelerated neutral particles.

15. An apparatus for producing accelerated particles, comprising:
   a chamber;
   a power source;
   a plasma coupling element providing power from said power source to a plasma within said chamber;
   a plasma generator for generating a plasma within said chamber; and
   means for providing a density gradient of said plasma to thereby accelerate particles, wherein said means for providing said gradient comprises a conductive shielding element disposed more proximately to a first portion of said plasma than to a second portion of said plasma, wherein said conductive shielding element reduces coupling to said plasma coupling element by said first portion as opposed to said second portion.

16. A method for controlling a plasma, the method comprising the steps of:
   providing a chamber;
   generating a plasma within said chamber;
   producing a density gradient of a plasma; and
   accelerating particles using said density gradient, wherein said step of producing a gradient comprises:
      providing an electromagnet having first and second conductive coils, wherein said second conductive coil is disposed coaxially to said first conductive coil;
      providing current through said first conductive coil in a first azimuthal direction; and
      providing current through said second coil in a second azimuthal direction opposite to said first azimuthal direction to produce a non-uniform magnetic field within said chamber that causes said density gradient to accelerate particles.

17. The process as claimed in claim 16, further comprising providing a permanent magnet.

18. The process as claimed in claim 16, further comprising:
   providing a substrate; and
   accelerating particles toward said substrate to process said substrate.

19. The process as claimed in claim 19, further comprising depositing a film on said substrate, wherein said step of accelerating particles toward said substrate is performed concurrently with said step of depositing said film.

20. The process as claimed in claim 19, further comprising using said accelerated particles to reactively etch a portion of said substrate.

21. The process as claimed in claim 20, further comprising recombining accelerated ions with electrons to produce accelerated neutral particles.

22. The process as claimed in claim 16 further comprising recombining accelerated ions with electrons to produce accelerated neutral particles.

23. A method for controlling a plasma, the method comprising the steps of:
   providing a chamber;
   providing a plasma coupling element;
   providing power to a plasma within said chamber using said plasma coupling element;
   producing a density gradient of said plasma; and
   accelerating particles using said density gradient, wherein said step of providing a density gradient comprises reducing coupling to said plasma coupling element by a first portion of said plasma as compared to a second portion of said plasma.

24. The process as claimed in claim 23, wherein said step of reducing coupling comprises:
   providing a conductive shielding element; and
   forming at least one slot penetrating said conductive shielding element to thereby increase coupling of said second portion of said plasma to said plasma coupling element.

25. The process as claimed in claim 24, wherein said step of forming at least one slot comprises tapering said at least one slot to vary in width from one end of said at least one slot to another end of said at least one slot.

26. The process as claimed in claim 24, wherein said step of forming at least one slot comprises non-linearly tapering said at least one slot to vary non-linearly in width from one end of said at least one slot to another end of said at least one slot, thereby providing said at least one slot with a curved edge.

27. A method for controlling a plasma, the method comprising the steps of:
   providing a chamber;
   providing a plasma coupling element;
   providing power to a plasma within said chamber using said plasma coupling element;
   providing a conductive shielding element disposed more proximately to a first portion of said plasma than to a second portion of said plasma; and
   forming at least one slot penetrating said conductive shielding element to thereby increase coupling of said second portion of said plasma to said plasma coupling element.

28. The process as claimed in claim 23, further comprising providing a substrate and accelerating particles toward said substrate to thereby process said substrate.

29. The process as claimed in claim 28, further comprising depositing a film on said substrate, wherein said step of accelerating particles toward said substrate is performed concurrently with said step of depositing said film.

30. The process as claimed in claim 28, further comprising using said accelerated particles to reactively etch a portion of said substrate.

31. The process as claimed in claim 30, further comprising recombining accelerated ions with electrons to produce accelerated neutral particles.

* * * * *